United States Patent
Ma et al.

(10) Patent No.: US 9,685,760 B1
(45) Date of Patent: Jun. 20, 2017

(54) PROGRAMMABLE CONTINUOUS WAVE HIGH POWER LASER DIODE SYSTEM

(71) Applicant: National Chung-Shan Institute of Science & Technology, Taoyuan (TW)

(72) Inventors: Chao-Tsung Ma, Miaoli (TW); Hsuang-Chang Chiang, Taipei (TW); Kun-Feng Chen, Taoyuan (TW); Yi-Lun Chen, Yilan County (TW)

(73) Assignee: National Chung-Shan Institute of Science & Technology, Taiwan (TW)

( * ) Notice: Subject to any disclaimer, the term of this patent is extended or adjusted under 35 U.S.C. 154(b) by 0 days.

(21) Appl. No.: 15/008,574

(22) Filed: Jan. 28, 2016

(51) Int. Cl.
*H01S 5/042* (2006.01)

(52) U.S. Cl.
CPC .................................. *H01S 5/042* (2013.01)

(58) Field of Classification Search
CPC ........... H01S 5/042; H01S 3/10; H01S 5/0608
USPC .................... 372/38.03, 38.02; 315/308, 294
See application file for complete search history.

(56) References Cited

U.S. PATENT DOCUMENTS

| 2007/0024213 | A1* | 2/2007 | Shteynberg | ........ H05B 33/0815 315/291 |
| 2009/0251934 | A1* | 10/2009 | Shteynberg | ........... H02M 3/155 363/81 |
| 2010/0026208 | A1* | 2/2010 | Shteynberg | ........ H05B 33/0815 315/297 |
| 2014/0368109 | A1* | 12/2014 | Goscha | .............. H05B 41/3927 315/34 |

* cited by examiner

*Primary Examiner* — Tuan Nguyen

(57) ABSTRACT

The present invention provides a programmable continuous wave high power laser diode system, which comprised digital control unit, a switch module unit, and a latch current controlling unit so as to provide user to set the latch current of the high power laser diode via the digital control unit controlling the switch module unit and the latch current controlling unit, therefore, the laser diode system includes advantages of high system efficiency, reliability, low output ripple current range and fast switching reaction time.

7 Claims, 11 Drawing Sheets

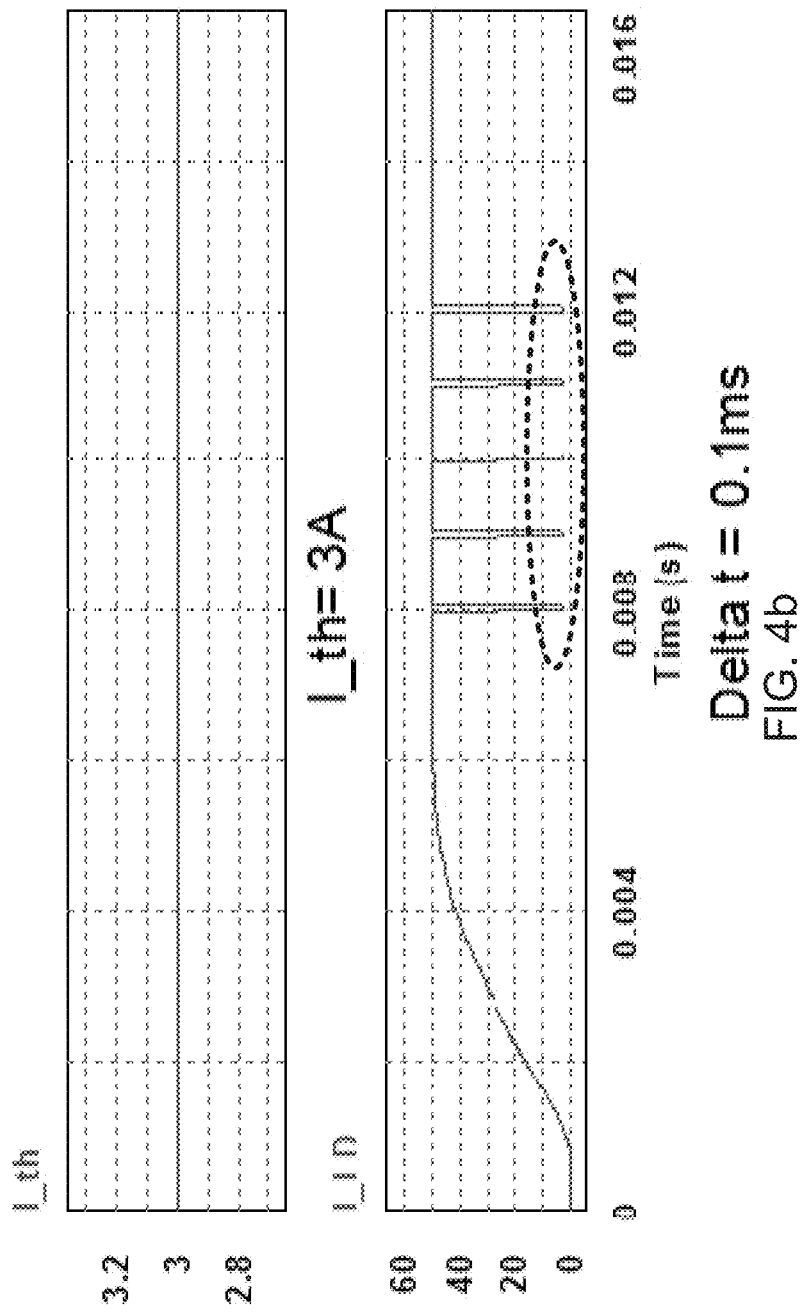

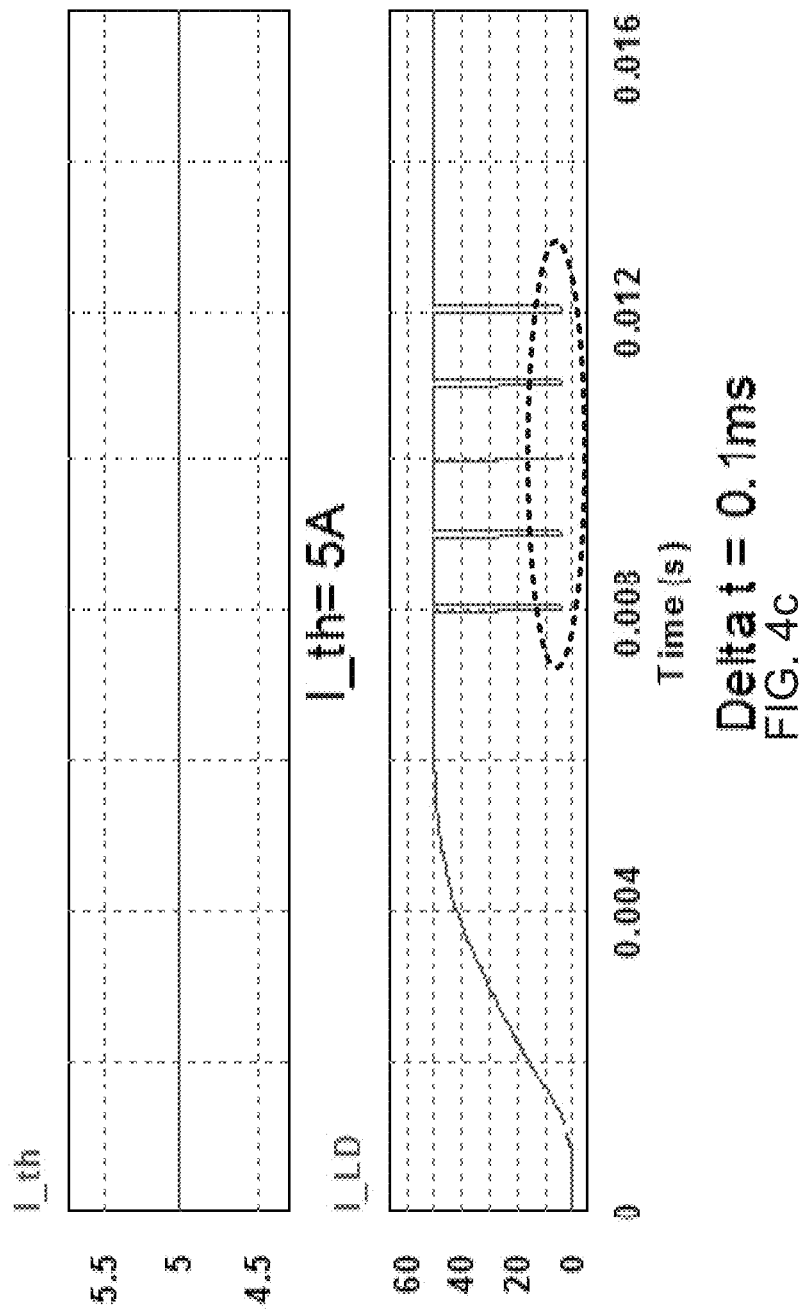

PROGRAMMABLE CONTINUOUS WAVE HIGH POWER LASER DIODE SYSTEM

BACKGROUND OF THE INVENTION

1. Field of the Invention

The present invention relates to the technology field of laser driving and controlling system, and more particularly to a programmable continuous wave high power laser diode system.

2. Description of the Prior Art

In recent years, techniques of laser diode are widely applied in the human social life, and according to the power levels thereof, techniques of laser diode are respectively applied to different areas. For example, the low power laser diodes are applied in medical, electronic products and communications systems fields, and the high laser diodes are applied in Industrial and military fields.

Moreover, in the technique of laser diode, power system for driving and emitting laser always play important roles, wherein according to the different features of the laser diode, the power systems are mainly divided into the following two kinds of power systems:

1. Power system of pulse/continuous laser: designed for users switching the laser system to output pulse mode or continuous output mode, wherein the output power is a fixed value in the continuous output mode, and in the output pulse mode, the output power is changed periodically; moreover, the output power of the peak of the output pulse mode is far greater than the output power of continuous output mode on the same timeline, however, the average value of the output power in the output pulse mode is less than the average value in the continuous output mode.

2. Power system of high power laser diode: with the application of high power laser system is more and more widely, the higher output power demand is also growing, wherein due to the cost of single high-power laser diode is very high and the continuous output power is very limited, the structure of current large continuous high-power laser diode usually realized by parallel or array type of high power laser diode modules, however, the power conversion efficiency and the control performance thereof are usually poor. Therefore, how to increase the power conversion efficiency and the control performance of the high power laser diode so as to elevate the laser power is a very important job for laser industry.

On the other hand, in the circuit structure of the laser power system can be divided into the following kinds according to the driving modes:

1. Switch-driven power system: can be classified into "constant current" and "constant power" switch circuit according to the circuit feature and the designing way of control and command, moreover, switch-driven power systems usually have higher efficiency but are slow to respond.

2. Linear drive power system: the circuit structure thereof is simple and high precision current control and the control method is more direct, but always has low efficiency and large volume.

Accordingly, in view of the laser control and power system to appear on the practical application of many defects, the case of the invention, the inventors tried to be studied, and finally developed the present invention a programmable continuous wave high power laser diode system.

SUMMARY OF THE INVENTION

The primary objective of the present invention is to provide a programmable continuous wave high power laser diode system, which comprised digital control unit, a switch module unit, and a latch current controlling unit so as to provide user to set the latch current of the high power laser diode via the digital control unit controlling the switch module unit and the latch current controlling unit, therefore, the laser diode system includes advantages of high system efficiency, reliability, low output ripple current range and fast switching reaction time.

Accordingly, in order to achieve the primary objective of the present invention, the inventor of the present invention provides a programmable continuous wave high power laser diode system comprises:

a control command unit;

a digital control unit, disposed for digital converting the command from the control command unit;

a switching DC-DC converter unit, disposed for converting power source and can be controlled by the control command unit and the digital control unit;

a latch current controlling unit, coupled to the switching DC-DC converter unit, and the latch current of the latch current controlling unit can be instantly adjusted by the control command unit and the digital control unit;

a switch module unit, coupled to the switching DC-DC converter unit, and the driving current on and off command signal of the switch module unit can be instantly adjusted by the control command unit and the digital control unit; and a laser diode unit, respectively coupled to the latch current controlling unit and switch module unit;

wherein the digital control unit can respectively control the latch current controlling unit, switch module unit and switching DC-DC converter unit, so as to adjust the output current of the laser diode unit.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIGS. 4a-4c show comparison diagrams between current of laser diode and latch current under the first condition;

DETAILED DESCRIPTION OF THE PREFERRED EMBODIMENTS

To more clearly describe a programmable continuous wave high power laser diode system according to the present invention, embodiments of the present invention will be described in detail with reference to the attached drawings hereinafter.

Figure 1:
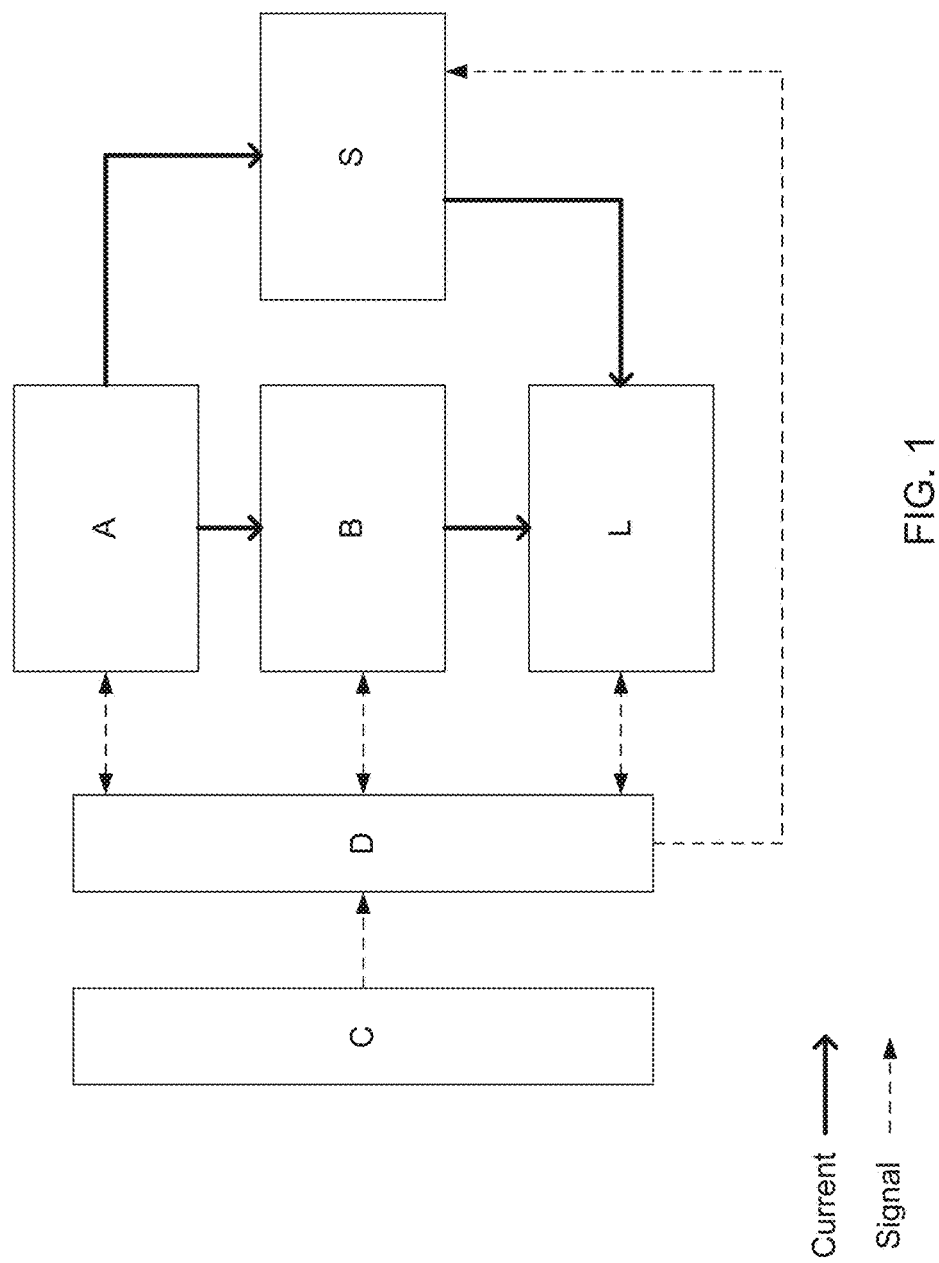
FIG. 1 shows a block diagram of the programmable continuous wave high power laser diode system according to the present invention.
Figure 2:
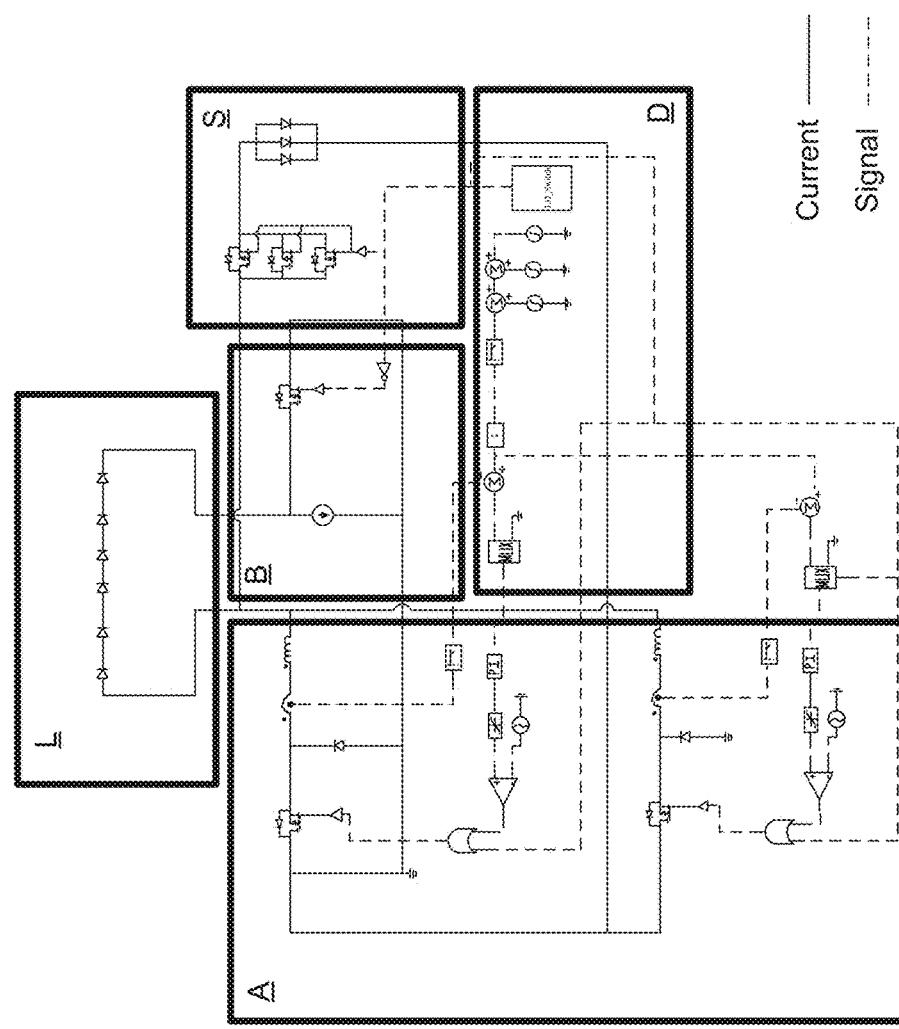
FIG. 2 shows a circuit diagram of the programmable continuous wave high power laser diode system according to the present invention.

Please refer to FIG. 1 and FIG. 2, there are block diagram and circuit diagram of embodiment of the programmable continuous wave high power laser diode system according to the present invention. As shown in FIG. 1 and FIG. 2, the programmable continuous wave high power laser diode system comprises: a digital control unit D, a switching DC-DC converter unit A, a latch current controlling unit B, a switch module unit S, a laser diode unit L, and a control command unit C.

The switching DC-DC converter unit A is disposed for converting power source, and the latch current controlling unit B is coupled to the switching DC-DC converter unit A, moreover, the latch current of the latch current controlling unit can be instantly adjusted by the control command unit and the digital control unit.

Furthermore, the switch module unit S is coupled to the switching DC-DC converter unit A and the laser diode unit L is respectively coupled to the latch current controlling unit B and switch module unit S, wherein the driving current on and off command signal of the switch module unit can be instantly adjusted by the control command unit and the digital control unit.

Inheriting to above description, the digital control unit is disposed for digital converting the command from the control command unit, and the digital control unit can respectively control the latch current controlling unit, switch module unit and switching DC-DC converter unit, so as to adjust the output current of the laser diode unit, therefore, the output power of the laser diode unit L can be controlled and adjust by the way mentioned above.

Besides, the digital control unit D can receive the laser diode current command and the power switch control command of the control command unit C and convert to digital signals, so as to respectively control the latch current of the latch current controlling unit B and the laser diode current switches of the switch module unit S; moreover, users can operate and adjust the laser diode current command of the control command unit C through a control program.

The switching DC-DC converter unit A can be a multi-phase interleaved buck converter circuit or a multi-phase interleaved synchronous rectification buck converter circuit or any kinds of converter unit.

Moreover, in the present invention, the switching DC-DC converter unit A is design in modular form with closed-loop and interleaved controlled, so as to provide a high power for high-current laser diode and achieve the effect of low output current ripple. Furthermore, according to the modular form with closed-loop and interleaved controlled design, the high power laser diode of the present invention can achieve advantages of high reliability, high efficiency, high heat dissipation, and balancing each current phases.

Figure 3:
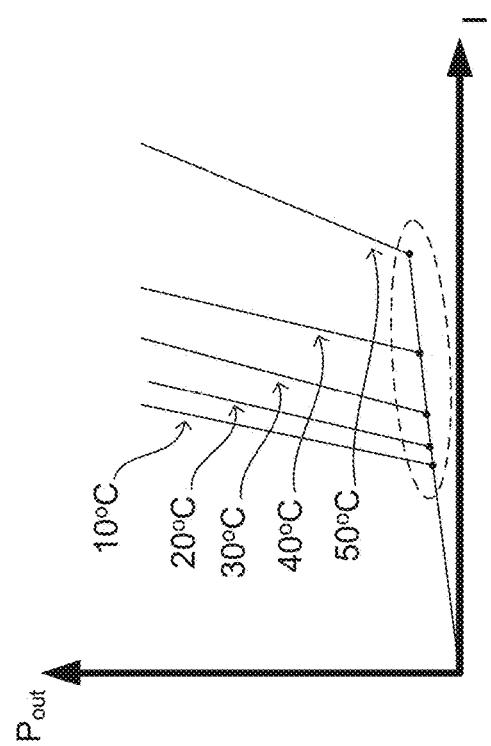
FIG. 3 shows a temperature profile of a latch current controlling unit.

In the present invention, the latch current of the latch current controlling unit B is the constant value, meanwhile, the constant value is also be the critical current of the laser diode unit L. Continuously referring to FIG. 1 and FIG. 2, and please refer to FIG. 3, there is shown the temperature profile of a latch current controlling unit. As the FIGS. shown, the output current might be changed with the working temperature and the physical condition thereof, so the latch current is also be a flowctuation.

Therefore, the change of latch current causes time deviation of output of diode laser, when switching control is operated, even the input current is under the same condition, the output time will be different. And in the present invention, the accurate, rapid regulation of the power output needed to be maintained through the instant controlled of the latch current so as to maintain the accuracy of the original design.

Inheriting to above description, control module of the latch current can implement a precision current command tracking function by an instant controllable current source, when the function is launched, the current source can be synchronously adjusted for coordinating the controlling condition of the laser diode, so as to adjust and maintain the current of the laser diode for achieving quickly current switching function of the high-power laser diode.

Therefore, through above descriptions, the programmable continuous wave high power laser diode system provided by the present invention has been introduced completely and clearly; then the advantages of the present invention will be introduced via the following data diagrams.

Figure 4A:
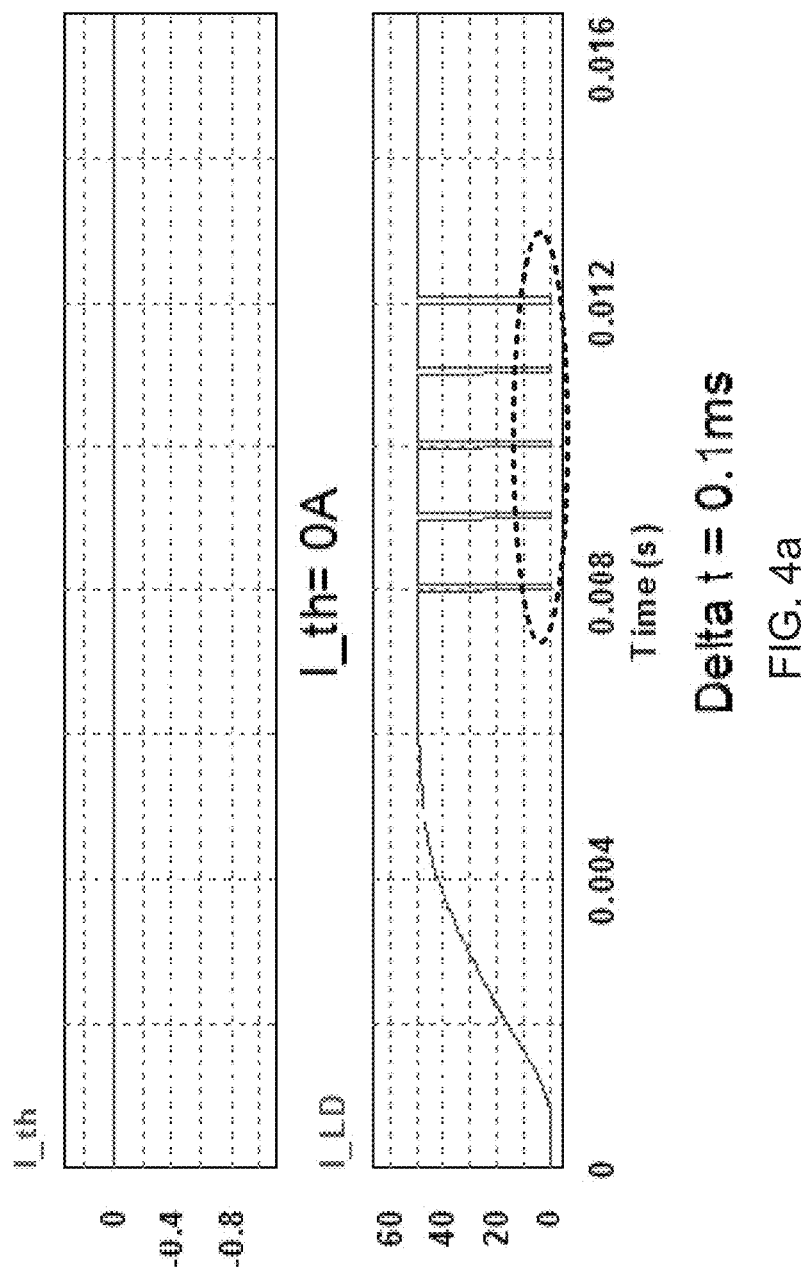

FIG. 4a to FIG. 4c show comparison diagrams between current of laser diode and latch current under the first condition, wherein, the continuous wave of the high-power laser diode is 50 A, and the simulate time is 8 ms, current stop every 1 ms and restart after 0.1 ms, stop and restart five times.

As FIG. 4a shows, when latch current value I_th do not been set, the laser diode current I_LD reduced to 0 A under each switching operation; however, as FIG. 4b shows, when latch current value I_th is set as 3 A, the laser diode current I_LD reduced to about 3 A under each switching operation; moreover, as FIG. 4c shows, when latch current value I_th is set as 5 A, the laser diode current I_LD reduced to about 5 A under each switching operation.

Figure 5A:
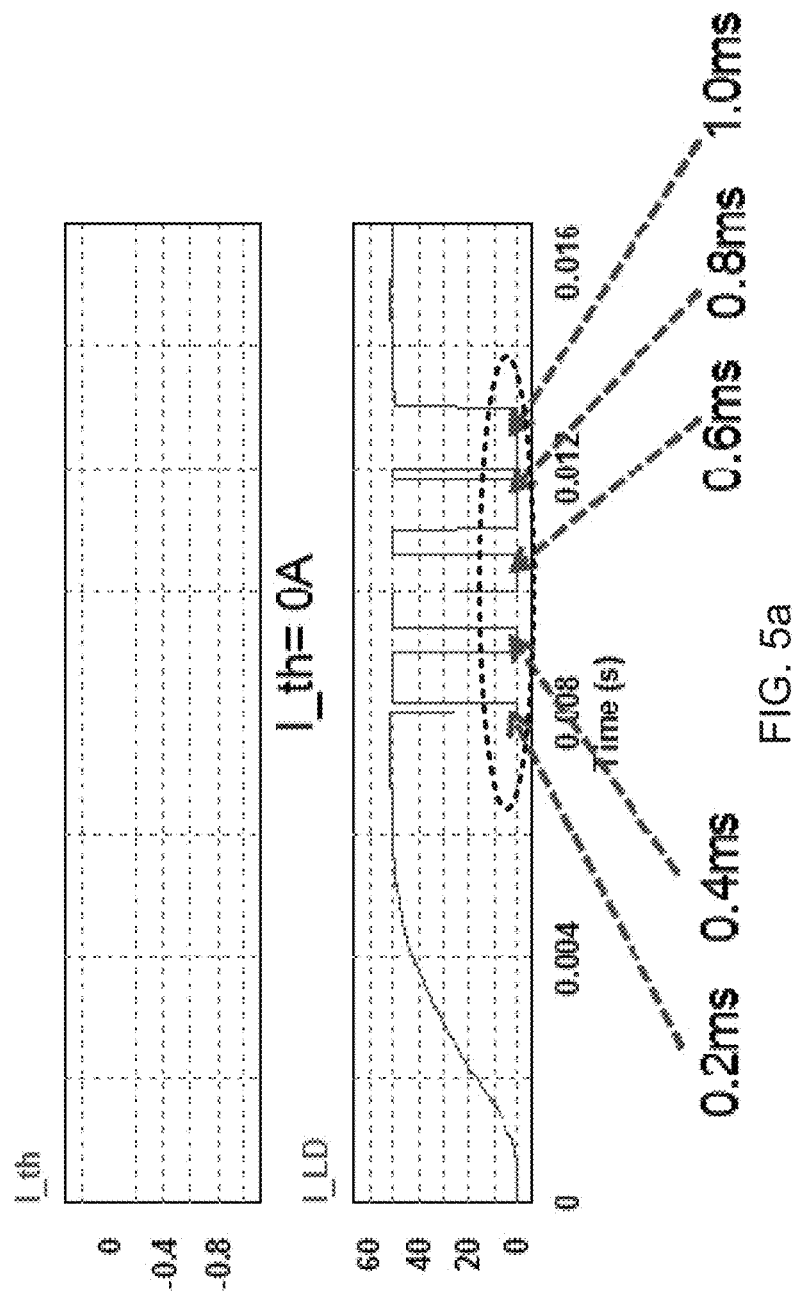
FIGS. 5a-5c show comparison diagrams between current of laser diode and latch current under the second condition.
Figure 5B:
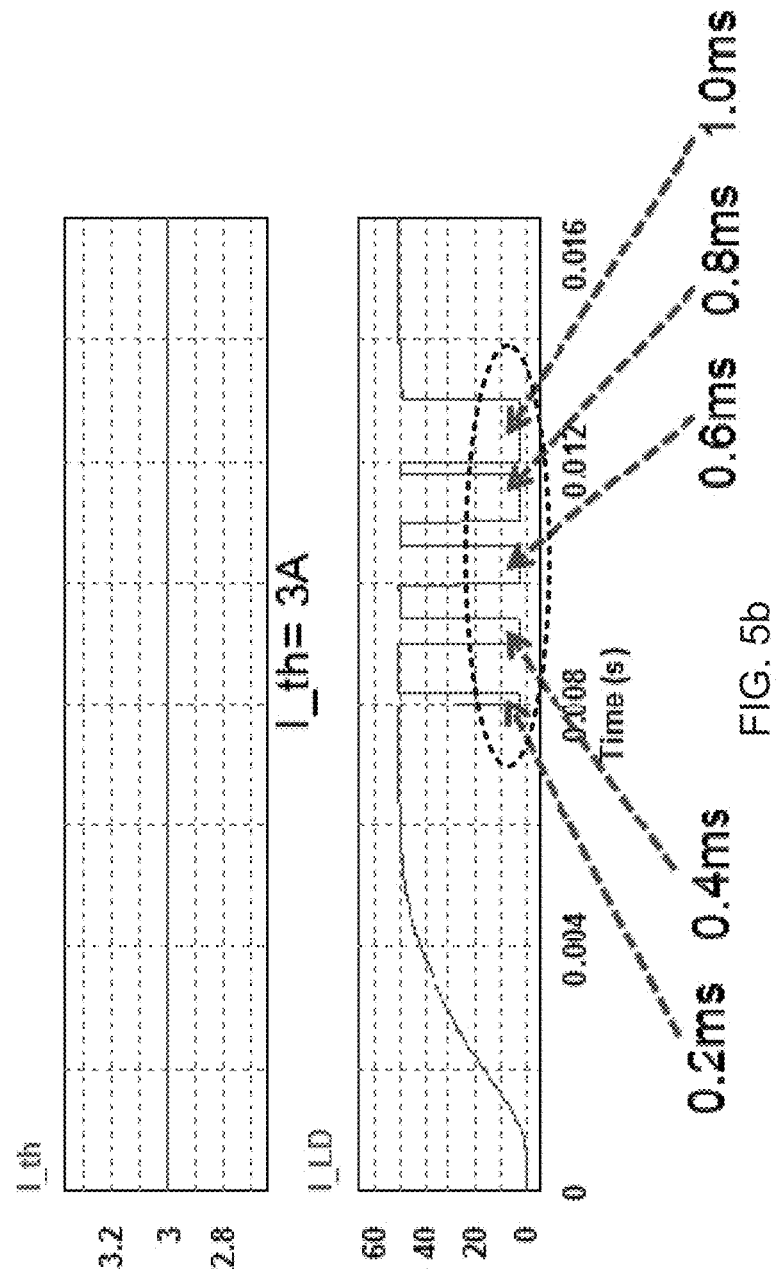
Figure 5C:
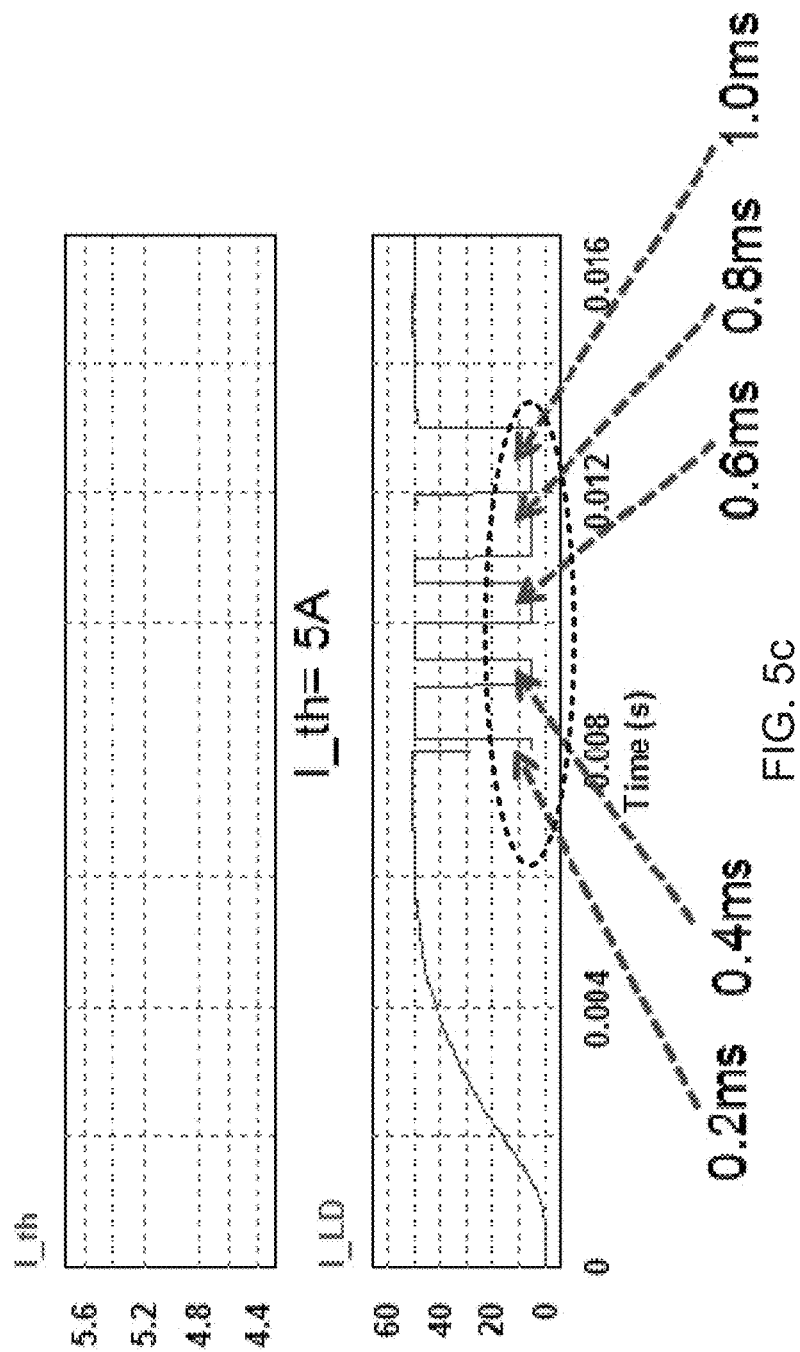

Besides, FIG. 5a to FIG. 5c show comparison diagrams between current of laser diode and latch current under the second condition, wherein, the continuous wave of the high-power laser diode is 50 A, and the simulate time is 8 ms, current stop every 1 ms and respectively restart after 0.2 ms, 0.4 ms, 0.6 ms, 0.8 ms, and 1 ms, stop and restart five times.

As FIG. 5a shows, when latch current value I_th has not been set, the laser diode current I_LD reduced to 0 A under each switching operation; however, as FIG. 5b shows, when latch current value I_th is set as 3 A, the laser diode current I_LD reduced to about 3 A under each switching operation; moreover, as FIG. 5c shows, when latch current value I_th is set as 5 A, the laser diode current I_LD reduced to about 5 A under each switching operation.

Figure 6:
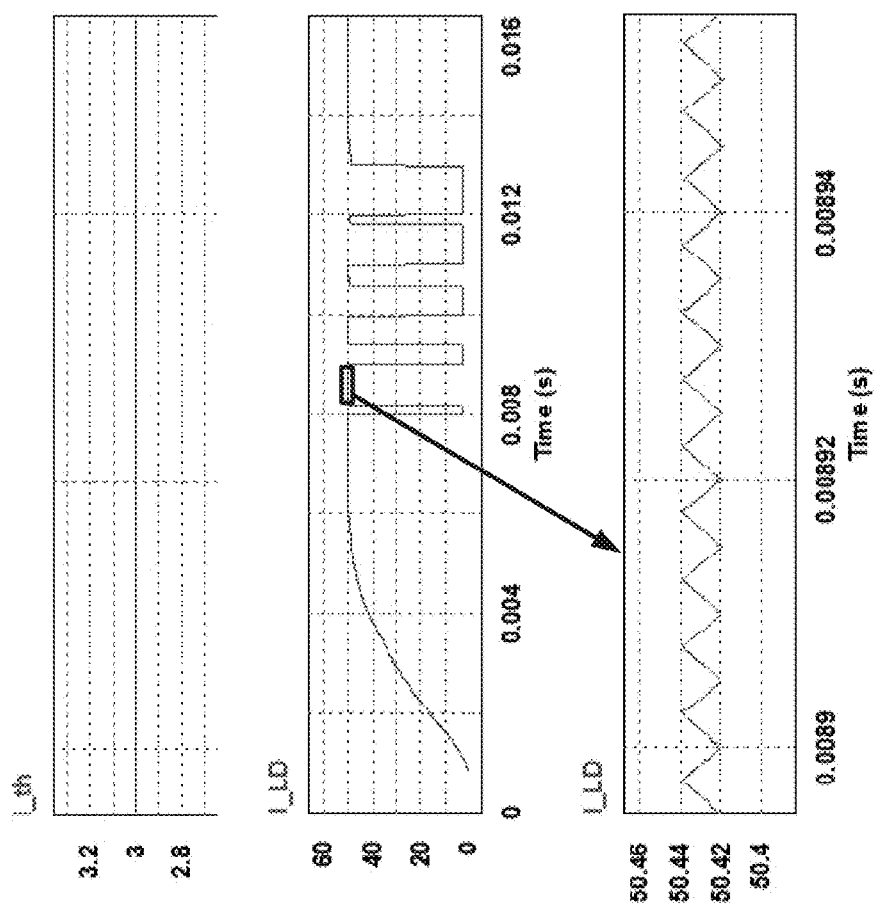
FIG. 6 shows driving current ripple of laser diode under the second condition.
Figure 7:
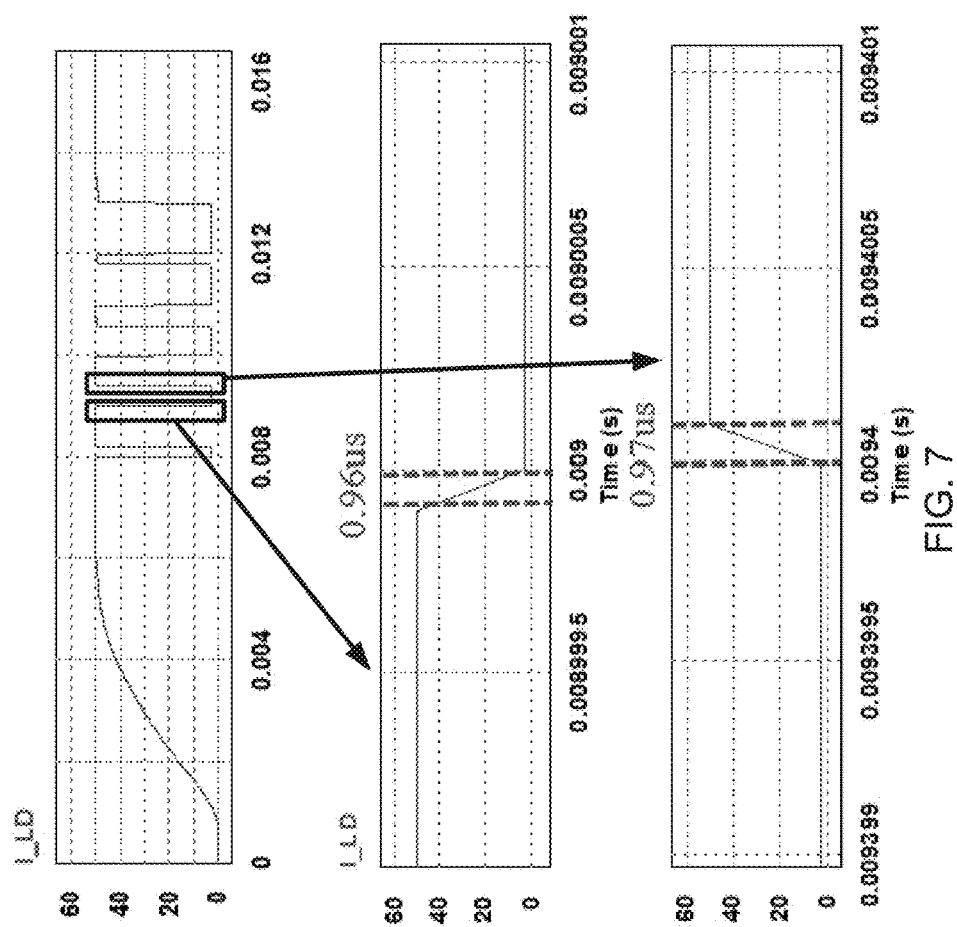
FIG. 7 shows falling and rising time of the driving current under the second condition.

Please refer to FIG. 6 and FIG. 7, there are respectively shown current wave data of laser diode and falling and rising time of the current. As the condition described above in FIG. 5b, when the latch current value I_th is set as 3 A and the continuous wave of the high-power laser diode is 50 A, as FIG. 6 shows, the peak-to-peak value is very small and the ripple current is very stable (0.04%); moreover, as FIG. 7 shows, according to the present invention, when the driving current of laser diode is operated on and off, the reaction time thereof is very short (0.96 μs and 0.97 μs).

Therefore, through above descriptions, the programmable continuous wave high power laser diode system provided by the present invention has been introduced completely and clearly; in summary, the present invention includes the advantages of:

(1) High system efficiency and high reliability.
(2) Low output ripple current range
(3) Can instantly adjust latch current of laser diode.
(4) With high-efficiency and fast (microsecond) on and off switch control.
(5) With programmable continuous wave on and off switch control.

The above description is made on embodiments of the present invention. However, the embodiments are not intended to limit scope of the present invention, and all equivalent implementations or alterations within the spirit of the present invention still fall within the scope of the present invention.

What is claimed is:

1. A programmable continuous wave high power laser diode system comprises:
   a control command unit;
   a digital control unit, disposed for digital converting command from the control command unit;
   a switching DC-DC converter unit, disposed for converting power source and can be controlled by the control command unit and the digital control unit;
   a latch current controlling unit, coupled to the switching DC-DC converter unit, and latch current of the latch current controlling unit can be instantly adjusted by the control command unit and the digital control unit;
   a switch module unit, coupled to the switching DC-DC converter unit, and driving current on and off command signal of the switch module unit can be instantly adjusted by the control command unit and the digital control unit; and
   a laser diode unit, respectively coupled to the latch current controlling unit and switch module unit;
   wherein the digital control unit can respectively control the latch current controlling unit, switch module unit and switching DC-DC converter unit, so as to adjust output current of the laser diode unit.

2. The programmable continuous wave high power laser diode system of claim 1, wherein the digital control unit can receive current command of the laser diode unit and power switch controlling command from the control command unit and convert to digital signals, so as to respectively adjust latch current of the latch current controlling unit and control switches of the switch module unit.

3. The programmable continuous wave high power laser diode system of claim 2, wherein users can operate and adjust laser diode current command of the control command unit through a control program.

4. The programmable continuous wave high power laser diode system of claim 1, wherein the switching DC-DC converter unit is a multi-phase interleaved buck converter circuit or a multi-phase interleaved synchronous rectification buck converter circuit.

5. The programmable continuous wave high power laser diode system of claim 1, wherein the laser diode unit is formed by a plurality of laser diodes, and laser diodes are disposed by series, parallel or matrix layout ways.

6. The programmable continuous wave high power laser diode system of claim 1, wherein latch current of the latch current controlling unit is the critical current value of the output laser of the laser diode unit.

7. The programmable continuous wave high power laser diode system of claim 1, wherein the switch module unit is consist of a plurality of electronic switches and a plurality of diodes disposed in parallel way.

* * * * *